(12) United States Patent  
Minamio et al.

(10) Patent No.: US 7,166,908 B2
(45) Date of Patent: Jan. 23, 2007

(54) OPTICAL DEVICE

(75) Inventors: Masanori Minamio, Osaka (JP); Eizou Fujii, Osaka (JP); Toshiyuki Fukuda, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/244,083

(22) Filed: Oct. 6, 2005

(65) Prior Publication Data

US 2006/0108656 A1    May 25, 2006

(30) Foreign Application Priority Data

Nov. 22, 2004   (JP) .............................. 2004-337309

(51) Int. Cl.
 *H01L 23/02*     (2006.01)
(52) U.S. Cl. ............................. 257/680; 257/E23.181; 257/434; 257/99
(58) Field of Classification Search ................ 257/434, 257/680, E23.181
See application file for complete search history.

(56) References Cited

U.S. PATENT DOCUMENTS 5,867,368 A * 2/1999 Glenn ........................ 361/783
6,765,236 B2 * 7/2004 Sakurai ....................... 257/98
6,787,869 B1 * 9/2004 Vittu .......................... 257/434
6,885,107 B2 * 4/2005 Kinsman .................... 257/778
6,906,405 B2 * 6/2005 Ono ........................... 257/680

FOREIGN PATENT DOCUMENTS

JP    2002-043554 A    2/2002

* cited by examiner

*Primary Examiner*—Leonardo Andujar
*Assistant Examiner*—Leslie P. Cruz
(74) *Attorney, Agent, or Firm*—McDermott Will & Emery LLP (57) ABSTRACT

An optical device according to the present invention includes a device substrate, a translucent member, an optical element chip and a conductive portion. On a surface of the device substrate, an opening is provided so as to extend substantially in the vertical direction with respect to a surface of the device substrate and pass through the device substrate, the translucent member is provided so as to cover a first opening mouth of the opening, and the optical element chip is provided so as to cover the other opening mouth thereof. Part of the conductive portion is buried in the device substrate. The outline of the first opening mouth has a point-asymmetrical shape with respect to an approximate center point of the first opening mouth.

4 Claims, 9 Drawing Sheets

OPTICAL DEVICE

CROSS-REFERENCE TO RELATED APPLICATION

This application claims priority under 35 U.S.C. §119(a) on Japanese Patent Application No. 2004-337309 filed on Nov. 22, 2004, the entire contents of which are hereby incorporated by reference.

BACKGROUND OF THE INVENTION

1. Field of the Invention

The present invention relates to optical devices and more particularly relates to an optical device including an optical element chip in which an optical device for emitting and receiving light.

2. Description of the Prior Art

Conventionally, optical semiconductor devices such as CCD modules included in a video camera, a digital camera, a digital still camera and the like have been known.

Figure 11:
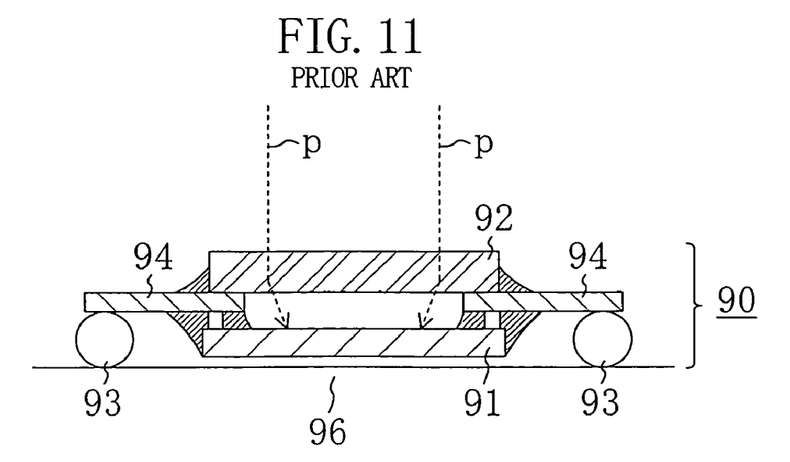
FIG. 11 is a cross-sectional view of a CCD package chip 90 in a known example.

For example, in Japanese Laid-Open Publication No. 2002-43554, a CCD package module 90 packaged by a flip-chip bonding technique are disclosed. In the CCD package module 90, as shown in Japanese Laid-Open Publication No. 2002-43554, a direct circuit (device substrate) 94 is provided mainly on a bottom surface of a glass (translucent member) 92, and the direct circuit 94 is bonded to an image capture chip (optical element chip) 91 by flip-chip packaging bonding. Furthermore, the direct circuit 94 is bonded to a printing circuit board (wiring board) 96 via a tin ball 93 by circuit binding. Then, a circuit is formed and packaged using the flip-chip bonding technique or various different substrates are combined to one another by the flip-chip bonding technique to form a package module for a thin type CCD image capture chip. Thus, the thickness of a package module for an image capture chip of a charge coupled device can be reduced. Moreover, light subjected to image processing by the CCD package module 90 passes through an imaging loci p and is received by an image capture chip 91.

As for the CCD package module 90, with the image capture chip 91 mounted on the printing circuit board 96, a voltage is applied to the image capture chip 91, thereby performing image processing. Therefore, it is necessary to mount the image capture chip 91 on the printing circuit board 96 so that the image capture chip 91 is properly placed on the printing circuit board 96. Specifically, the image capture chip 91 has to be mounted onto the printing circuit board so that the tin ball 93 electrically connected to an input/output terminal of the image capture chip 91 and a connection terminal provided on the printing circuit board 96 and corresponding to the tin ball 93 are matched in position. Assume that the image capture chip 91 is placed and mounted onto the printing circuit board 96 in a wrong manner. For example, if the image capture chip 91 is placed and mounted with being shifted by 180 degrees with respect to the printing circuit board 96, there might be cases where a voltage is not applied to the image capture chip 91 and, as a result, image processing can not be performed.

Furthermore, in recent years, miniaturization of a video camera, a digital camera, a digital still camera and the like has been desired. Accordingly, reduction in the size of an optical device included in such a device is also desired.

SUMMARY OF THE INVENTION

In view of the points described above, the present invention has been devised and it is therefore an object of the present invention to provide an optical device in which orientation identification is allowed and of which size can be reduced.

A first optical device according to the present invention includes: a device substrate including an opening formed so as to extend substantially in the vertical direction with respect to a surface of the device substrate and pass through the device substrate; a translucent member provided so as to cover a first opening mouth of the opening; an optical element chip provided so as to cover a second opening mouth of the opening and including an optical element for emitting or receiving light in a surface of the optical element chip facing the translucent member; a conductive portion provided so as to have part buried in the device substrate and including first terminal portions each of which is electrically connected to the optical element and second terminal portions each of which is electrically connected to a wiring board; and an encapsulant for encapsulating an electrical connection portion of the optical element and each of the first terminal portions. In the first optical device, an outline shape of the first opening mouth is point-asymmetrical with respect to an approximate center point of the first opening mouth.

Herein, the opening is a three-dimensional space and each of the first opening mouth and the second opening mouth is a two-dimensional area in a surface of the device substrate. Specifically, the first opening mouth is an opening mouth located in one surface of the device substrate and covered by the translucent member, the second opening mouth is an opening mouth located in the other surface of the device substrate and covered by the optical element chip, and the opening is a pillar-shaped space with the first opening mouth as one base and the second opening mouth as the other base.

Moreover, the approximate center point substantially coincides with the barycenter of the outline of the first opening mouth. It is preferable that the approximate center point of the first opening mouth coincides with the center point of the device substrate.

In the first optical device, it is preferable that the first opening mouth having a point-asymmetrical outline shape has the function of indicating a position orientation of the second terminal portions in the device substrate.

Herein, the position orientation of the second terminal portions means to be an orientation identified by positions of terminals having specific functions, respectively. Functions of the terminals are an input terminal for inputting a voltage to the optical element, an output terminal for outputting a outputting a voltage to the wiring board, a power supply terminal and the like. For example, the position orientation of the second terminal portions is different between the case where the input terminal, the output terminal, the power supply terminal are arranged in this order from left to right and the case where the power supply terminal, the output terminal, and the input terminal are arranged in this order from left to right. Moreover, "the first opening mouth having a point-asymmetrical outline shape has the function of indicating a position orientation of the second terminal portions" means that the position orientation of the second terminal sections can be uniquely defined by visual identification and measurement of the outline shape of the first opening mouth.

In one preferred embodiment of the first optical device, an outline of the first opening mouth has an approximate rectangular shape obtained by linearly cutting off at least a portion including a vertex of a rectangle. In other words, the outline shape of the first opening mouth in this case is a point-asymmetrical polygon of which at least two interior angles are obtuse angles and other interior angles are right angles. In this case, the approximate center of the first opening mouth is a center point of the rectangular shape.

In another preferred embodiment of the first optical device, an outline of the first opening mouth has an approximate rectangular shape obtained by roundly cutting off at least a portion including a vertex of a rectangle. In other words, the outline shape of the first opening mouth in this case is a shape having a circumference with part including one of four vertexes of a rectangle and having an arc-shape. In another way, the outline shape of the first opening mouth can be described as a shape having a circumference with part including one of four vertexes of a rectangle and formed into a rounded corner. Also, in this case, the approximate center of the first opening mouth is a center point of the rectangular shape.

Moreover, in the first optical device, the outline of the first opening mouth may have a shape obtained by forming an area reduction portion at least in part of the outline of a regular polygon so that the area of the first opening mouth is smaller than the area of the polygon. In said one preferred embodiment, the portion including at least a vertex of the rectangle and linearly cut off is the area reduction portion. In said another preferred embodiment, the portion including at least a vertex of the rectangle and roundly cut off is the area reduction portion. Also, the area reduction portion may be a concave portion formed at least in a side of a rectangle. The shape of the concave portion is not particularly limited. In such a case, the approximate center point of the first opening mouth is a center point of the regular polygon.

Moreover, in the first optical device, the outline of the first opening mouth may have a shape obtained by forming an area increasing portion at least in part of the outline of a regular polygon so that the area of the first opening mouth is larger than the area of the polygon. It is preferable that the area increasing portion is provided as a single piece with the regular polygon in at least part of the outline of the regular polygon. The shape of the area increasing portion may be part of a circuit, part of a polygon and the like and is not particularly limited. In this case, an approximate center point of the first opening mouth is a center point of the regular polygon.

Furthermore, in the first optical device, the outline of the first opening mouth may have a shape obtained by forming an area reduction portion at least in part of the outline of a circle so that the area of the first opening mouth is smaller than the area of the circle. Moreover, in the first optical device, the outline of the first opening mouth may have a shape obtained by forming an area increasing portion at least in part of the outline of a circle so that the area of the first opening mouth is larger than the area of the circle. It is preferable that a specific example of each of the area reduction portion and the area increasing section is formed in the above-described manner. In this case, the approximate center point of the first opening mouth is a center point of the circle.

A second optical device according to the present invention includes: a device substrate including an opening formed so as to extend substantially in the vertical direction with respect to a surface of the device substrate and pass through the device substrate; a translucent member provided so as to cover a first opening mouth of the opening; an optical element chip provided so as to cover a second opening mouth of the opening and including an optical element formation surface in which an optical element for emitting or receiving light is formed; a conductive portion provided so as to have part buried in the device substrate and including first terminal portions each of which is electrically connected to the optical element and second terminal portions each of which is electrically connected to a wiring board; and an encapsulant for encapsulating an electrical connection portion of the optical element and each of the first terminal portions. In the second optical device, the optical element formation surface faces the translucent member, and an orientation-indicating marker for indicating a position orientation of the second terminal portions in the device substrate is formed in a surface of the optical element chip located in an opposite side to the optical element formation surface. It is preferable that the orientation-indicating marker is given in a known marking method.

Moreover, in the second optical device, it is preferable that the orientation-indicating marker is formed of at least a character or a symbol. "The orientation-indicating marker is formed of at least a character or a symbol" means that the orientation-indicating marker is formed of at least a character, or at least a symbol, or a combination of one or more characters and one or more symbols.

A third optical device according to the present invention includes: a device substrate including an opening formed so as to extend substantially in the vertical direction with respect to a surface of the device substrate and pass through the device substrate; a translucent member provided so as to cover a first opening mouth of the opening; an optical element chip provided so as to cover a second opening mouth of the opening and including an optical element for emitting or receiving light in a surface of the optical element chip facing the translucent member; a conductive portion provided so as to have part buried in the device substrate and including first terminal portions each of which is electrically connected to the optical element and second terminal portions each of which is electrically connected to a wiring board; and an encapsulant for encapsulating an electrical connection portion of the optical element and each of the first terminal portions. In the third optical device, an orientation-indicating through hole for indicating a position orientation of the second terminal portions in the device substrate is formed. In the third optical device, it is preferable that the orientation-indicating through hole is formed in some other part of the device substrate than parts thereof in which the second terminal portions are formed and the encapsulant member is provided.

An "opening extending substantially in the vertical direction with respect to a surface of the device substrate and passing through the device substrate" in each of the first, second and third optical devices means to be not only an opening extending in the vertical direction in a strict mathematical sense but also an opening extending in the direction slightly shifted from the vertical direction in a strict mathematical sense.

Moreover, "translucent" of the translucent member in each of the first, second and third optical devices means to be being capable of transmitting light at a transmittance of 70% or more, preferably, 80% or more and, more preferably, 90% or more.

Moreover, as the "optical element" in each of the first, second and third optical devices, a solid state imaging element such as a CCD (charge-coupled device), a set of a plurality of light receiving elements discretely arranged, a light emitting element or the like may be used. When the optical element is a solid state imaging element, the optical device serves as a solid state imaging device. When the optical element is a light receiving element or a light emitting element, the optical device serves as a light receiving device or a light emitting device.

DESCRIPTION OF THE PREFERRED EMBODIMENTS

Hereinafter, embodiments of the present invention will be described in detail with reference to the accompanying drawings. Note that the present invention is not limited to the following embodiments.

First Embodiment

Figure 1A:
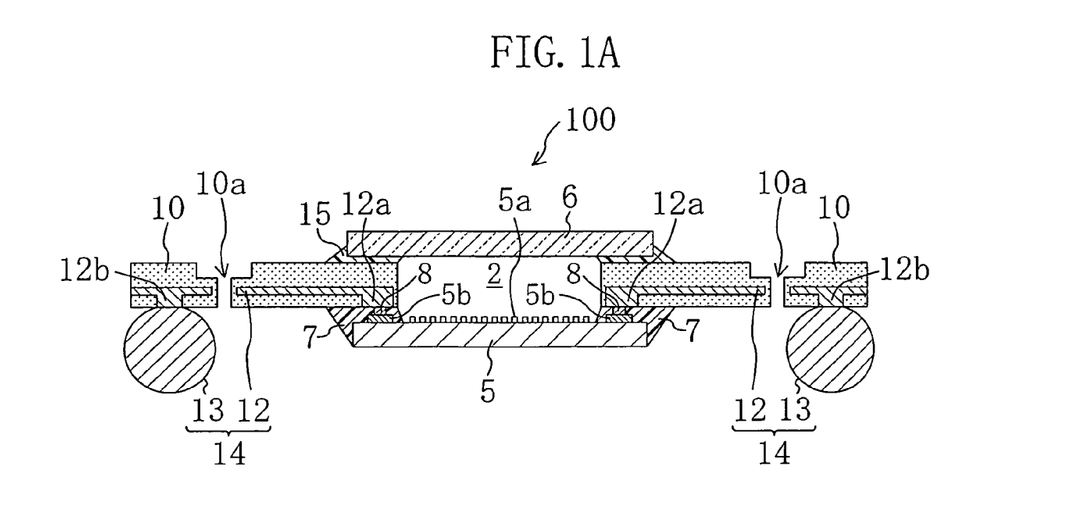
FIGS. 1A and 1B are views illustrating the structure of an optical device 100 according to a first embodiment of the present invention.
Figure 1B:
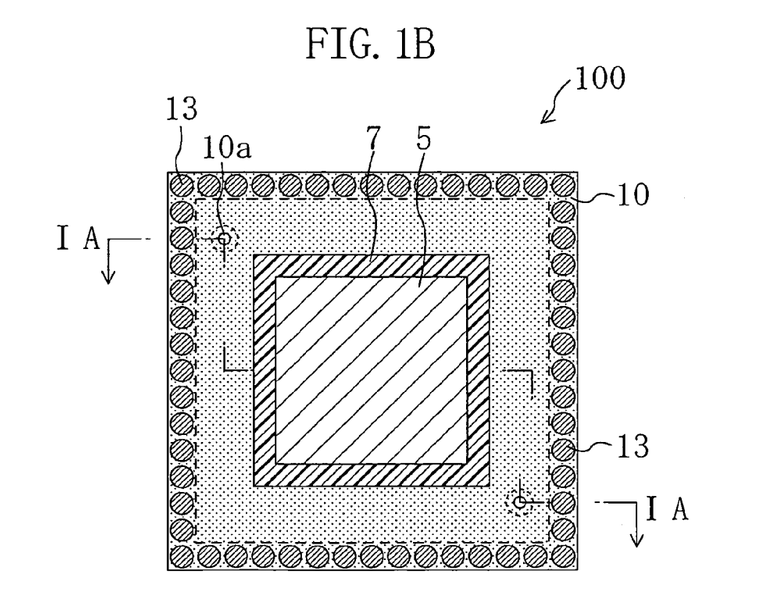
Figure 2A:
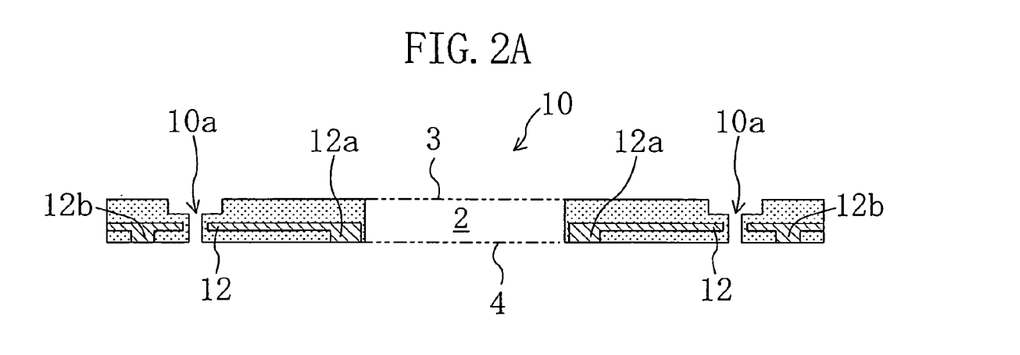
FIGS. 2A and 2B are views illustrating the structure of a device substrate 10 according to the first embodiment.
Figure 2B:
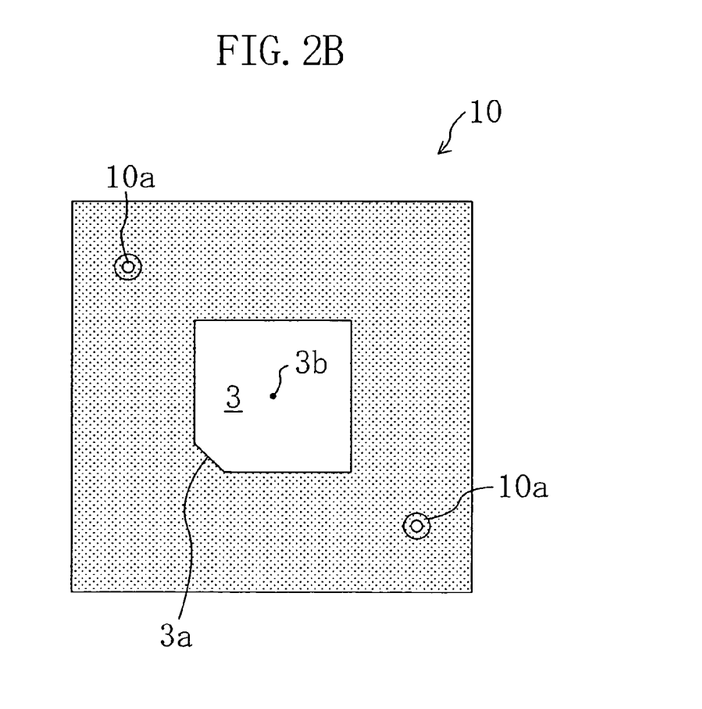

In a first embodiment, the structure of an optical device 100 and a method for fabricating the optical device 100 will be described with reference to FIGS. 1, 2, 3 and 4. FIGS. 1A and 1B are views illustrating the structure of the optical device 100. FIG. 2 is a view illustrating the structure of a device substrate 10. FIGS. 3A through 3F are cross-sectional views illustrating respective steps for fabricating the optical device 100. And FIG. 4 is a cross-sectional view illustrating part of steps for fabricating the optical device 100. Moreover, FIG. 1B is a view illustrating a back side of the optical device 100. FIG. 1A is a cross-sectional view taken along the line IA—IA of FIG. 1B. FIG. 2A is also a cross-sectional view taken along the line IA—IA of FIG. 1B. And FIG. 1B is a plan view illustrating a surface of the device substrate 10 having a first opening mouth 3.

Structure of Optical Device 100

First, the structure of the optical device 100 will be described.

As shown in FIGS. 1A and 1B, the optical device 100 of this embodiment includes the device substrate 10 in which an opening 2 is formed so as to extend substantially in the vertical direction to surfaces of the device substrate 10 and pass through the device substrate 10, a translucent member 6 provided so as to cover a first opening mouth 3 (shown in FIG. 2A) of the opening 2, an optical element chip 5 which is provided so as to cover a second opening mouth 4 (shown in FIG. 2A) of the opening 2 and in which an optical element for emitting/receiving light is formed in a surface of the optical element chip 5 so as to face the translucent member 6, and conductive portions 14 each having part buried in the device substrate 10. In this case, the translucent member 6 is preferably formed of a material such as glass having a transmittance of at least 70% or more.

In the optical element chip 5, as an optical element, formed is one of the following optical elements: a solid state imaging element such as a CCD, a set of a plurality of light receiving elements discretely arranged, and a light emitting element. A surface (optical element formation surface) 5a of the optical element chip 5 in which the optical element is formed faces the translucent member 6. Thus, when an optical element for emitting light is formed in the optical element chip 5, light emitted from the optical element passes through the opening 2 in the device substrate 10, transmits through the translucent member 6 and is output to the outside of the optical device 100. When an optical element for receiving light is formed in the optical element chip 5, light transmits through the translucent member 6, is input into the optical device 100, passes through the opening 2 in the device substrate 10 and then is received by the optical element. Moreover, electrode pads 5b are provided so as to be electrically connected to an outer peripheral portion of the optical element formation surface 5a and bumps (protruding electrodes) 8 are provided so that each of the bumps 8 is electrically connected to a surface of an associated one of the electrode pads 5b.

The device substrate 10 is formed of a plastic resin such as an epoxy resin or ceramic. Moreover, two position defining holes 10a uses as references for defining a center position of the optical device 100 in the X and Y directions are formed. The two position defining holes 10a are used as reference positions in mounting the optical element chip 5 in fabrication process steps for the optical device 100 or references for defining a location in which a cylindrical mirror storing an optical system such as a lens is installed when the cylindrical mirror is installed in an optical apparatus. In this case, if two or more holes 10a for position defining are provided, the center position of the optical device 100 can be found. Therefore, it is preferable that two or more position defining holes 10a are provided. As shown in FIG. 2A, the opening 2 in the device substrate 10 is a three dimensional space and, more specifically, is a pillar-shaped space having the first opening mouth 3 as one of the bases in one surface of the device substrate 10 covered by the translucent member 6 and the second opening mouth 4 as the other one of the bases in the other surface of the device substrate 10 covered by the optical element chip 5. The outline shape of the first opening mouth 3 and the outline shape of the second opening mouth 4 are substantially the same. The outline shape of the first opening mouth 3 will be described later.

Each of the conductive portions 14 includes an interconnect portion 12 buried in the device substrate 10 and a second terminal portion 13 which is in contact with a surface of the device substrate 10 and electrically connected to a wiring board.

The interconnect portion 12 includes a main interconnect portion extending substantially in parallel to the surfaces of the device substrate 10 and terminal portions each of which is provided so as to extend from the main interconnect portion toward the surface of the device substrate 10 in which the second opening mouth 4 is formed. The terminal portions are an internal terminal portion (first terminal portion) 12a and an external terminal portion 12b, and are provided in this order so that the external terminal portion 12b is more distant from the opening 2 than the internal terminal portion 12a. One edge portion of each of the terminal portions 12a and 12b is formed as a unit with the main interconnect portion. The other edge portion of the internal terminal portion 12a is electrically connected with an associated one of the bumps 8 and the other edge portion of the external terminal portion 12b is electrically connected to the second terminal portion 13.

As for the second terminal portion 13, a plurality of second terminal portions 13 are provided around an perimeter of the surface of the device substrate 10 having the second opening mouth 4 so as to be arranged symmetrically with respect to a center point of the device substrate 10 in the surface thereof having the second opening mouth 4. The second terminal portions 13 have different functions from one another. For example, some of the second terminal portions 13 serve as input terminals for inputting a voltage to the optical element, others of the second terminal portions 13 serve as output terminals for outputting a voltage from the second terminal to the wiring board, and still others of the second terminal portions 13 serve as power supply source terminals.

An electrical connection portion between the optical element and the internal terminal portion 12a is encapsulated by a first sealing resin (encapsulant) 7. Thus, a void between the optical element chip 5 and the device substrate 10 is encapsulated by the first sealing resin 7, so that the optical element chip 5 is fixed to the device substrate 10. Moreover, a void between the translucent member 6 and the device substrate 10 is encapsulated by a second sealing resin 15, so that the translucent member 6 is fixed to the device substrate 10. Moreover, the first sealing resin 7 and the second sealing resin 15 prevent invasion of unnecessary light and moisture in the air into the inside of the optical device 100. Therefore, the optical device 100 has a more excellent performance than that of an optical device in which an electrical connection portion and the like are not encapsulated.

The shape of the opening 2 in the device substrate 10, which is a feature of this embodiment, will be described. An outline shape of the first opening mouth 3 is point-asymmetrical with respect to an approximate center point 3b of the first opening mouth 3. Specifically, the outline of the first opening mouth 3 has a shape obtained by cutting off a portion including one of four vertexes of a rectangle (hereinafter part 3a of the outline of the first opening mouth from which the portion including the vertex has been cut off will be referred to as a "point-asymmetrical portion 3a"). In other words, the outline shape of the first opening mouth 3 is a point-asymmetrical pentagon. Two of five interior angles of the pentagon are obtuse angles and the other three are right angles. The translucent member 6 covering the first opening mouth 3 has a transmittance of 70% or more. Therefore, when the optical device 100 is observed through the translucent member 6, the point-asymmetrical portion 3a can be visually identified. For example, if the opening 2 is formed so that the point-asymmetrical potion 3a is located in part of the outline of the first opening mouth 3 which is the closest to one of the second terminal portions 13 (e.g., one of the second terminal portions 13 located closest to a first pin) having a specific function, the position of the second terminal portion 13 can be identified by observing the optical device 100 through the translucent member 6 from the first opening mouth 3 side to visually identify the point-asymmetrical portion 3a. Thus, the point-asymmetrical portion 3a has the function of indicating the position orientation of the second terminal portions 13 in the device substrate 10. Accordingly, by observing the optical device 100 through the translucent member 6, for example, the position of one of the second terminal portions 13 serving as an input terminal and the position of another of the second terminal portions 13 serving as an output terminal can be identified.

Hereinafter, the reason why the outline shape of the first opening mouth 3 is point-asymmetrical with respect to the approximate center point 3b of the first opening mouth 3 will be described.

In recent years, miniaturization of video cameras, digital cameras, digital still cameras and the like has been desired and, accordingly, reduction in the size of an optical device included in such equipment is required. As shown in FIG. 1A, the size of an optical device is defined depending on the size of a device substrate. Therefore, the size of the device substrate is reduced, thereby allowing miniaturization of the optical device.

On the other hand, if the size of a device substrate is reduced too much, the number of second terminal portions provided in a surface of the device substrate is reduced. As has been described, the second terminal portions have different functions from one another, and if the number of the second terminal portions is reduced, an optical device or the like can not exhibit its desired function. Therefore, it is preferable that the size of the device substrate is sufficiently large so that a sufficient number of second terminal portions can be provided on the device substrate and is sufficiently small so that miniaturization of a video camera or the like can be achieved.

Furthermore, it is preferable that the position orientation of the second terminal portions can be identified by observing the optical device. Since the second terminal portions have different functions from one another, merely mounting the optical device on a wiring board might cause a situation where the optical element of the optical device can not emit desired light or perform image processing to received light. To avoid such a situation, it is preferable that the position orientation of one of the second terminal portions having a specific function can be identified through visual identification by observation of the optical device. As a possible technique for allowing the visual identification of the position orientation of one of the second terminal portions having a specific function, for example, use of a device substrate having a shape obtained by linearly cutting off a portion including one of vertexes of the device substrate located closest to one of the second terminal portions having a specific function or a device substrate in which marking is given around one of the second terminal portions having a specific function is considered. And, an optical device including such a device substrate can be mounted on a wiring board in consideration of a position orientation of interconnects in an optical device chip. Thus, the situation described above can be avoided.

However, when either one of the above-described two device substrates is used, the following problems arise. First, a problem that arises when the device substrate having a shape obtained by linearly cutting off a portion including one of vertexes of the substrate is used will be described. With use of the device substrate having one of the above-described shapes, positions of ones of the second terminal portions around the cut-off portion has to be changed.

Accordingly, the positions of the internal terminal portions and the second terminal portions in the device substrate are limited. Moreover, when a cylindrical mirror or the like is installed in an optical apparatus in which an optical device having the device substrate is mounted on a wiring board, the outside shape of the device substrate is limited because the portion including one of vertexes of the device substrate is linearly cut off. Therefore this technique is not preferable.

With use of the device substrate in which marking is given around one of the second terminal portions having a specific function, a space for marking is required and therefore the size of the device substrate can not be reduced. Accordingly, the optical device can not be miniaturized. Moreover, if projections and depressions are formed in a surface of the device substrate to give marking onto the surface of the device substrate, level differences are generated in the surface of the device substrate. Therefore, the degree of flatness of the optical device including the device substrate is reduced, and when a cylindrical mirror is installed in the optical apparatus in which the optical device is mounted on a wiring board, a tilt generated in installing the cylindrical mirror is influenced.

However, in the optical device 100 of this embodiment, the point-asymmetrical portion 3a is part of the outline of the first opening mouth 3 and therefore the positions of the internal terminal portions 12a and the second terminal portions 13 do not have to be changed. Also, almost no space is required for the point-asymmetrical portion 3a and thus the device substrate 10 can be miniaturized. As a result, miniaturization of the optical device 100 can be achieved. Furthermore, the device substrate 10 is formed so as to have a rectangular shape and also no level difference in the surface. Therefore, when a cylindrical mirror or the like is installed in an optical apparatus in which the optical device 100 is mounted on a wiring board, the outside shape of the device substrate is not regulated and a tilt generated in mounting the cylindrical mirror is not influenced.

Furthermore, the point-asymmetrical portion 3a has the function of indicating the position orientation of the second terminal portions 13 in the device substrate 10. Thus, by observing the optical device 100 through the translucent member 6, for example, the position of one of the second terminal portions 13 serving as an input terminal and the position of another of the second terminal portions 13 serving as an output terminal can be identified. Accordingly, if the optical device 100 is observed through the translucent member 6 from the first opening mouth 3 side in the device substrate 10 and the optical device 100 is mounted on a wiring board, for example, the optical device 100 can be mounted so that one of the second terminal portions 13 serving as an input terminal matched in position with a connection terminal provided on the wiring board and corresponding to the input terminal. Therefore, a situation where a voltage is not applied to the optical element or a situation where an excessive voltage is applied can be avoided, and thus the optical element can emit desired light and perform image processing of received light.

Process Steps for Fabricating Optical Device 100

Figure 3A:
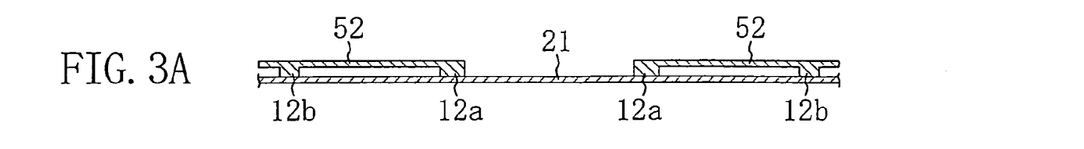
FIGS. 3A through 3F are cross-sectional views illustrating respective steps for fabricating the optical device 100 according to the first embodiment.
Figure 4A:
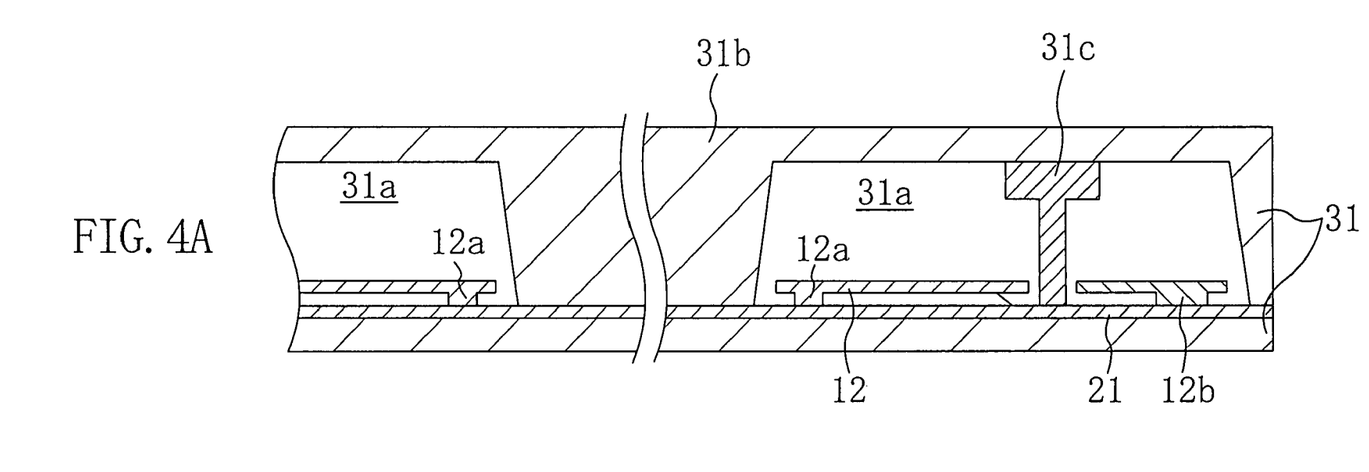
FIGS. 4A and 4B are cross-sectional views illustrating respective part of steps for fabricating the optical device 100 according to the first embodiment.
Figure 4B:
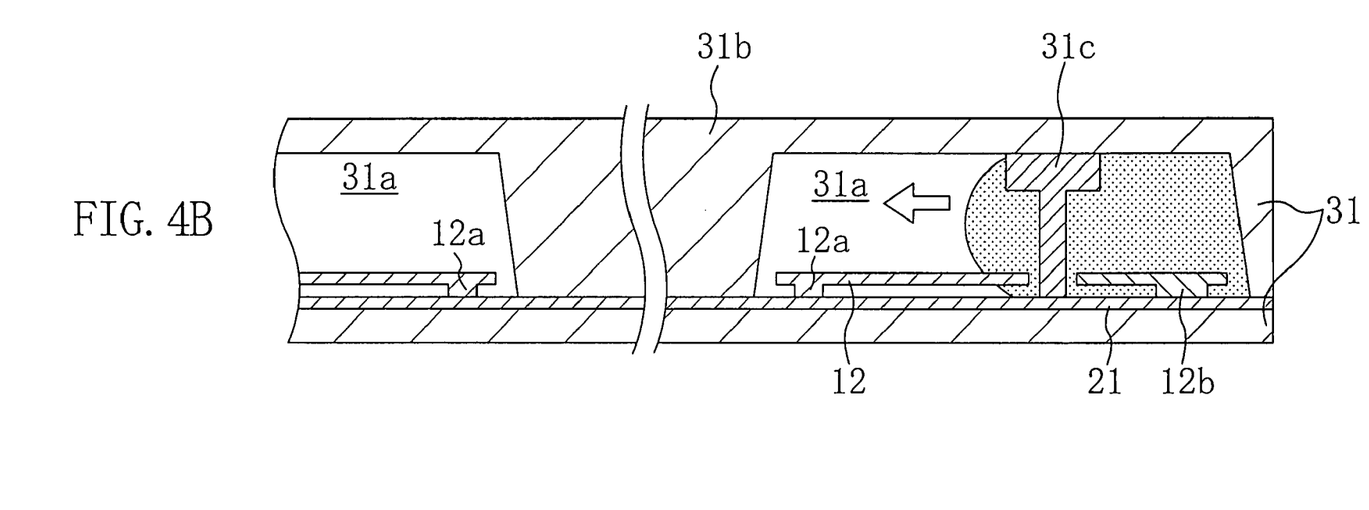

First, as shown in FIG. 3A, a lead frame 52 in which an interconnect pattern is formed is placed on a sealing tape 21. In this case, half-etching or stamping is performed so that a concave portion is formed so as to be located under most part of the lead frame 52 and only parts of the lead frame 52 to be an internal terminal portion 12a and an external terminal portion 12b are left as protruding potions extending downward from a bottom surface of the concave portion. Thus, a lead frame member in which the lead frame 52 is provided on the sealing tape 21 is formed. The lead frame 52 is divided into interconnect portions 12 in a later process step.

Figure 3B:
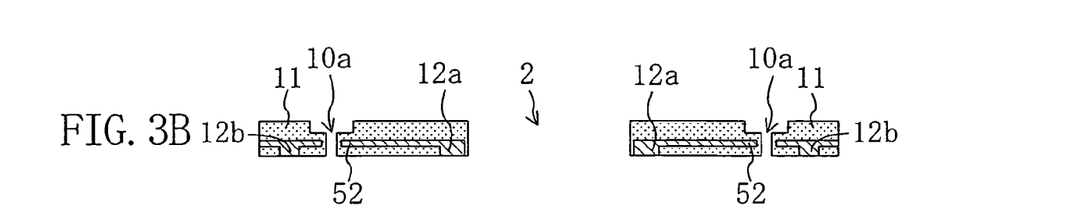

Next, as shown in FIG. 3B, molding is performed. The details of the molding are shown in FIGS. 4A and 4B. In this process step, first, the lead frame member described above is placed in a molding die 31. In this case, the molding die 31 is shown as a single piece member in FIG. 4A, but the molding die 31 actually includes a lower molding die and an upper molding die covering the lower molding die each of which is formed of an approximately flat plate. The upper molding die includes a die cavity 31a, a divider portion 31b and pin members 31c in one surface of the upper molding die. Each of the pin members 31c is provided in the die cavity 31a. The divider portion 31b is part to be an opening 2 and has a pillar shape with bases having an approximate rectangular shape obtained by linearly cutting off a portion including a vertex linearly. Moreover, the pin members 31c are parts to be position defining holes 10a. With the lead frame 52 facing upward, the lead frame member is placed on a surface of the lower molding die. Then, the upper molding die is turned so that a surface thereof on which the die cavity 31a are formed faces downward and then placed over the lead frame member so as to cover the lead frame member. Thus, the die cavity 31a is covered by the lead frame member and the lower molding die. Then, as shown in FIG. 4B, a plastic resin such as an epoxy resin is filled in the die cavity 31a. Thereafter, when the plastic resin is anchored, the molding die is removed and the sealing tape 21 is peeled off from the lead frame member. Thus, a molded body 11 in which the lead frame 52 is buried is obtained. In this case, the internal terminal portions 12a and the external terminal portions 12b are exposed at one surface of the molded body 11.

Although not shown in the drawings, the molded body 11 is placed so that the exposed surfaces of the internal terminal portions 12a and the external terminal portions 12b face upward. Then, a boundary portion between optical device formation regions located adjacent to each other is cut at the center of a cutting portion, thereby dividing the molded body 11 into individual optical devices. Thus, device substrates 10 including the interconnect portions 12 buried therein, respectively, are obtained.

Figure 3C:
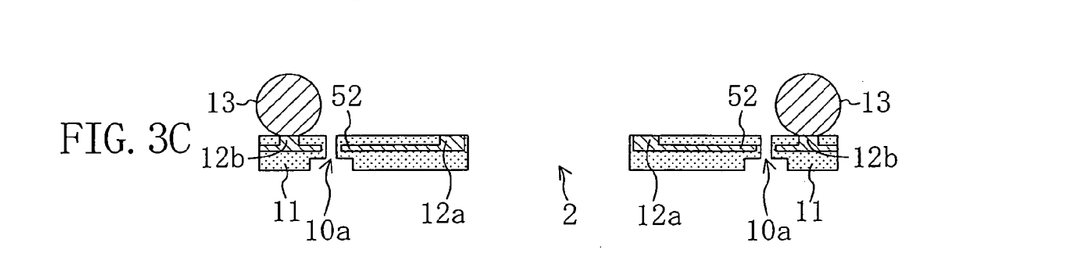

Subsequently, in the process step of FIG. 3C, a plurality of second terminal portions 13 are provided on the exposed surfaces of the external terminal portion 12b, respectively. In this case, it is preferable that the second terminal portions 13 are provided so as to be point symmetrical with respect to a substantially center point of a device substrate 10.

Figure 3D:
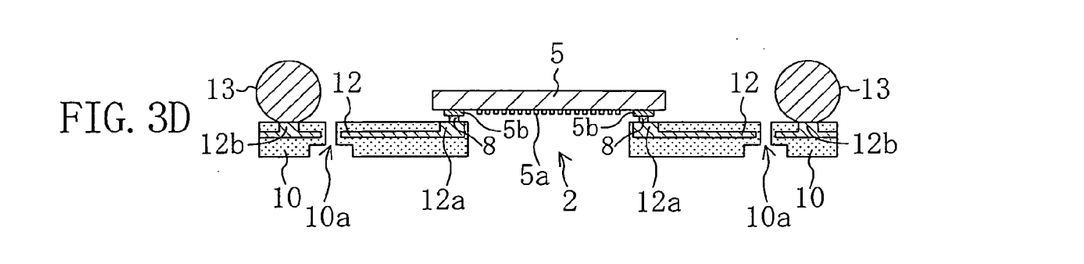

Thereafter, in the process step of FIG. 3D, with the optical element formation surface 5a of the optical element chip 5 facing downward, the optical element chip 5 is mounted so as to cover an opening (second opening mouth) in the same surface as the exposed surface of each of the internal terminal portions 12a and the external terminal portions 12b. In this case, bumps 8 are formed on the exposed surface of the internal terminal portions 12a, respectively, and then electrode pads 5b of the optical element chip 5 are provided on the bumps 8, respectively, so that each of the bumps 8 is flip-chip connected to an associated one of the electrode pads 5b. Note that in placing the optical element chip 5, if the position of the optical element chip 5 is defined using the position defining holes 10a provided in the device substrate 10 as references, the optical element chip 5 can be placed in a desired orientation with respect to the device substrate 10.

Figure 3E:
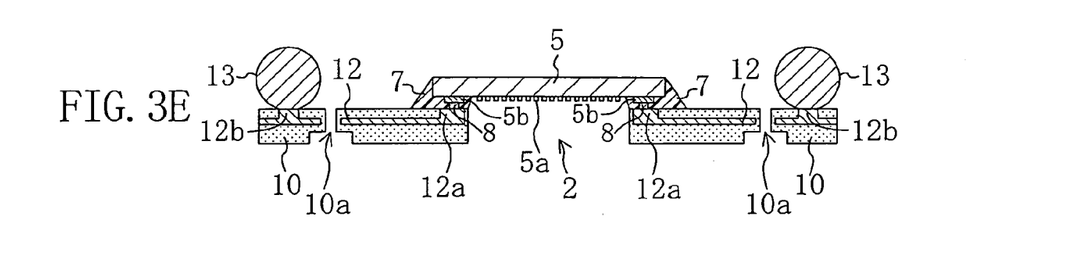

Then, in the process step of FIG. 3E, the internal terminal portion 12a, the bumps 8 and the electrode pads 5b are encapsulated using a first sealing resin 7. Thus, an electrical connection portion between the optical device and each of the interconnect portions 12, i.e., a void between the optical element chip 5 and a peripheral portion of the opening 2 is encapsulated by the first sealing resin 7.

Figure 3F:
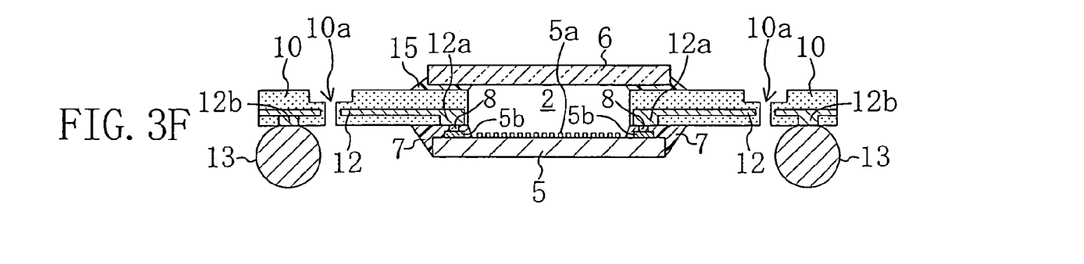

Then, in the process step of FIG. 3F, a molded body obtained in the process step of FIG. 3E is placed so that the optical element chip 5 is placed at the bottom and the translucent member 6 is mounted so as to cover a surface (first opening mouth) of the opening 2 which is not covered. A void between the translucent member 6 and the peripheral portion of the opening 2 is encapsulated using a second sealing resin 15. Thus, the optical device 100 of this embodiment can be fabricated.

When an optical device is fabricated using a device substrate including an opening of which a first opening mouth has a point symmetrical outline shape with respect to the substantially center point of the opening, a divider portion in an upper molding die used in the above-described molding process step has a pillar shape with a rectangular base. On the other hand, when an optical device is fabricated using the device substrate 10 of this embodiment, the divider portion 31b in the upper molding die used in the molding process step has a pillar shape with a base having a substantially rectangular shape obtained by linearly cutting off a portion including a vertex. That is, if the shape of a base of the divider portion of the upper molding die is changed to a substantially rectangular shape obtained by linearly cutting off a portion including a vertex, the optical device 100 in which the position orientation of the second terminal portions 13 in the device substrate 10 can be identified by observing the second terminal portions 13 through the translucent member 6.

Second Embodiment

Figure 5:
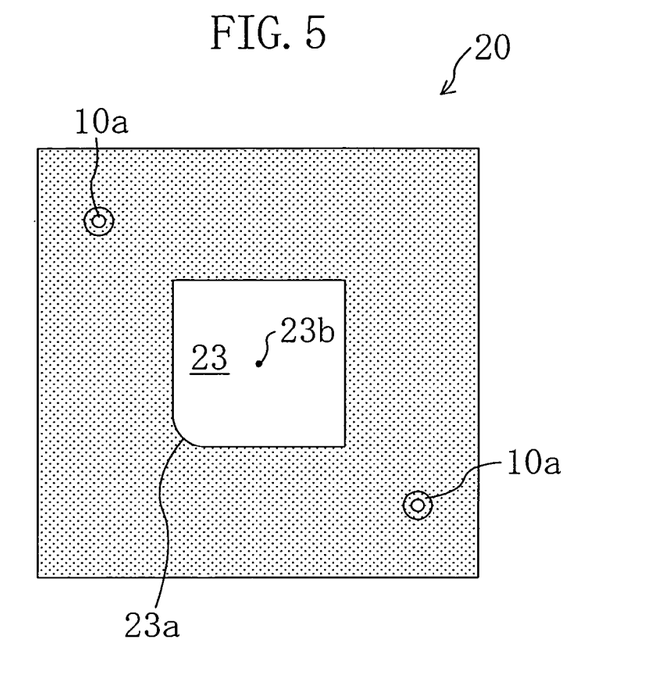
FIG. 5 is a plan view of a device substrate 20 according to a second embodiment of the present invention.

In a second embodiment, the structure of a device substrate 20 will be described with reference to FIG. 5. Note that FIG. 5 is a plan view illustrating a surface of the device substrate 20 having a first opening mouth.

According to this embodiment, an optical device is obtained by replacing the device substrate 10 of the optical device shown in FIGS. 1A and 1B with the device substrate 20. Other than that, the structure of the optical device and a method for fabricating the optical device according to this embodiment are the same as those of the first embodiment and therefore the description thereof will be omitted.

The device substrate 20 of this embodiment and the device substrate 10 of the first embodiment are different from each other only in the outline shape of an opening. The outline of a first opening mouth 23 in the device substrate 20 of this embodiment has a shape obtained by roundly cutting off a portion including one of vertexes of a rectangle (hereinafter part 23a of the outline of the first opening mouth 23 from which the portion including the vertex has been roundly cut off will referred to as a "point asymmetry portion 23a). In other words, the outline shape of the first opening mouth 23 is a shape having a circumference with part including one of four vertexes of a rectangle and having an arc-shape. In another way, the outline shape of the first opening mouth 23 can be described as a shape having a circumference with part including one of four vertexes of a rectangle and formed into a rounded corner. If an opening is formed so that the point-asymmetrical portion 23a is located in part of the outline of the first opening mouth 23 located closest to one of second terminal portions having a specific function, the position of one of the second terminal portions having a specific function can be identified through visual identification by observing the optical device from the first opening mouth 23 side through a translucent member. Therefore, the point-asymmetrical portion 23a has the function of indicating the position orientation of the second terminal portions in the device substrate 20. Accordingly, the optical device of this embodiment exhibits approximately the same effects as those of the optical device 100 of the optical device.

Note that a divider portion of an upper molding die used in the step of molding in the method for fabricating an optical device according to this embodiment has a pillar shape with a base having an approximately rectangular shape obtained by roundly cutting off a portion including a vertex.

Third Embodiment

Figure 6:
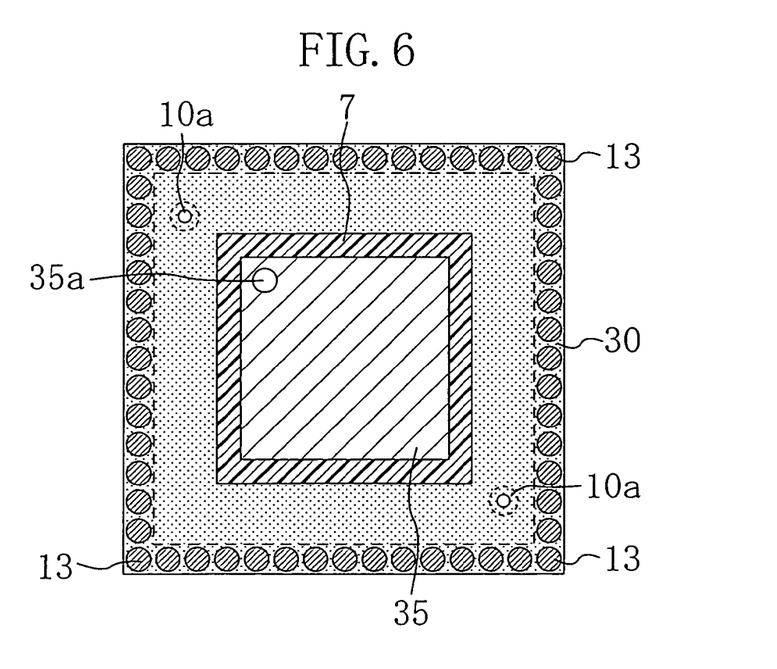
FIG. 6 is a plan view of a device substrate 30 according to a third embodiment of the present invention.

In a third embodiment, the structure of a device substrate 30 will be described with reference to FIG. 6. FIG. 6 is a view illustrating a back surface of an optical device.

According to this embodiment, an optical device is obtained by replacing the optical element chip 5 and the device substrate 10 of the optical device shown in FIGS. 1A and 1B with an optical element chip 35 and the device substrate 30, respectively. Other than that, the structure of the optical device and a method for fabricating the optical device according to this embodiment are the same as those of the first embodiment and therefore the description thereof will be omitted.

In the device substrate 30 of this embodiment, the outline shape of a first opening mouth is a rectangle. Thus, the position orientation of second terminal portions 13 can not be identified through visual identification by observing the device substrate 30 through a translucent member. However, the position orientation of second terminal portions 13 in the device substrate 30 can be identified through visual identification in a different manner because an optical element chip 35 has a characteristic described below. Hereinafter, the optical element chip 35 of this embodiment will be described.

In the optical element chip 35, as shown in FIG. 6, an orientation-indicating marker 35a having a circular shape and indicating the position orientation of the second terminal portions 13 in the device substrate 30 is formed in vicinity of a vertex in the back surface of the optical element chip 35 (having a rectangular shape). For example, the orientation-indicating marker 35a is provided in part of the back surface of the optical element chip 35 located close to one of the second terminal portions 13 having a specific function. Thus, the position of one of the second terminal portions 13 having a specific function can be identified through visual identification by observing the back surface of the optical device. Therefore, the optical device of this embodiment exhibits approximately the same effects as those of the optical device 100 described in the first embodiment.

It is preferable that the orientation-indicating marker 35a is given by a known marking method. Also, the shape of the marker 35a is not limited to a circular shape but may be a polygonal shape or the like.

Moreover, a divider portion of an upper molding die used in the step of molding in the method for fabricating an optical device according to this embodiment has a pillar shape with a rectangular base.

Fourth Embodiment

Figure 7A:
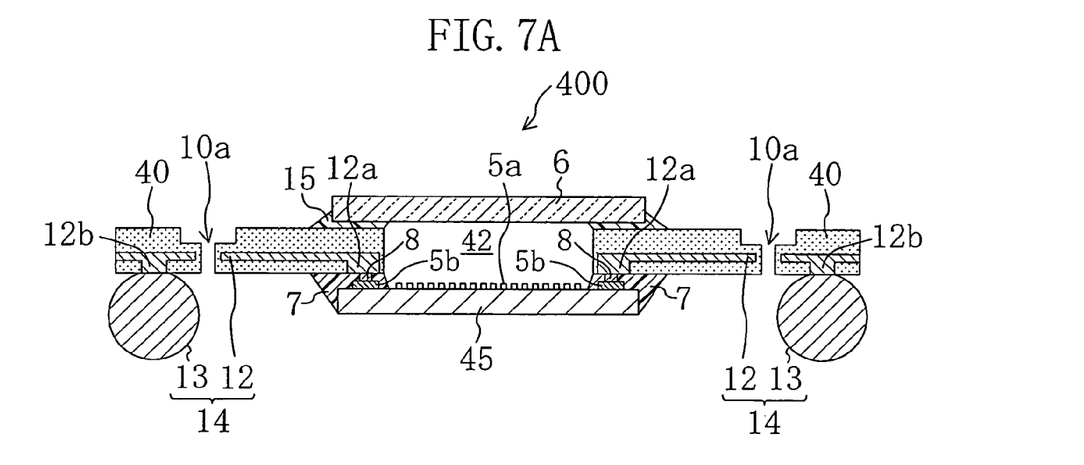
FIGS. 7A and 7B are views illustrating the structure of an optical device 400 according to a fourth embodiment of the present invention.
Figure 7B:
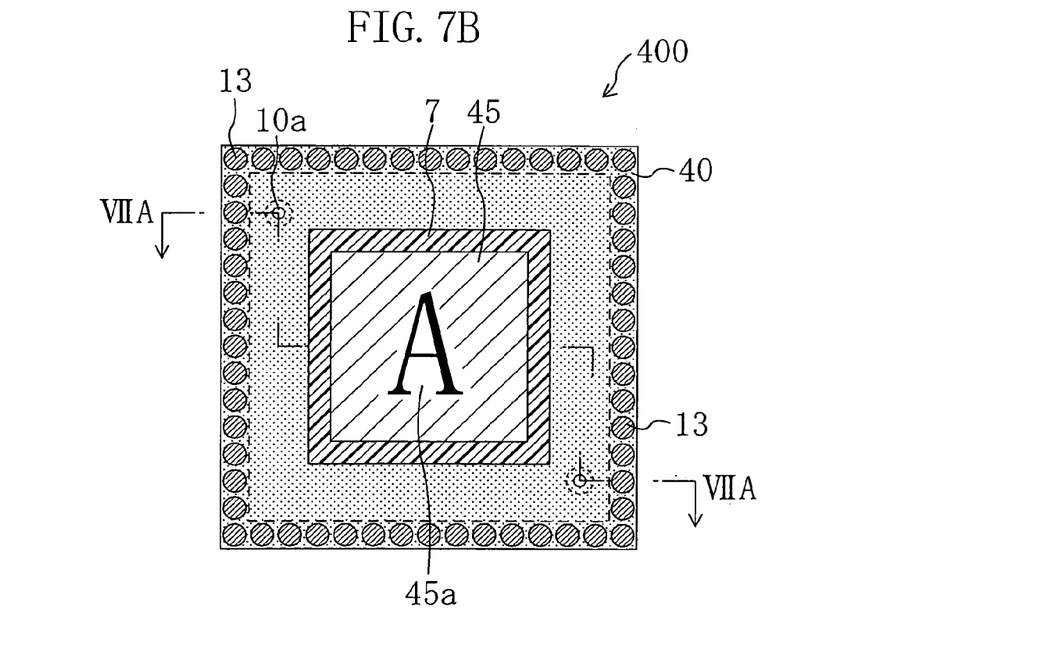
Figure 8:
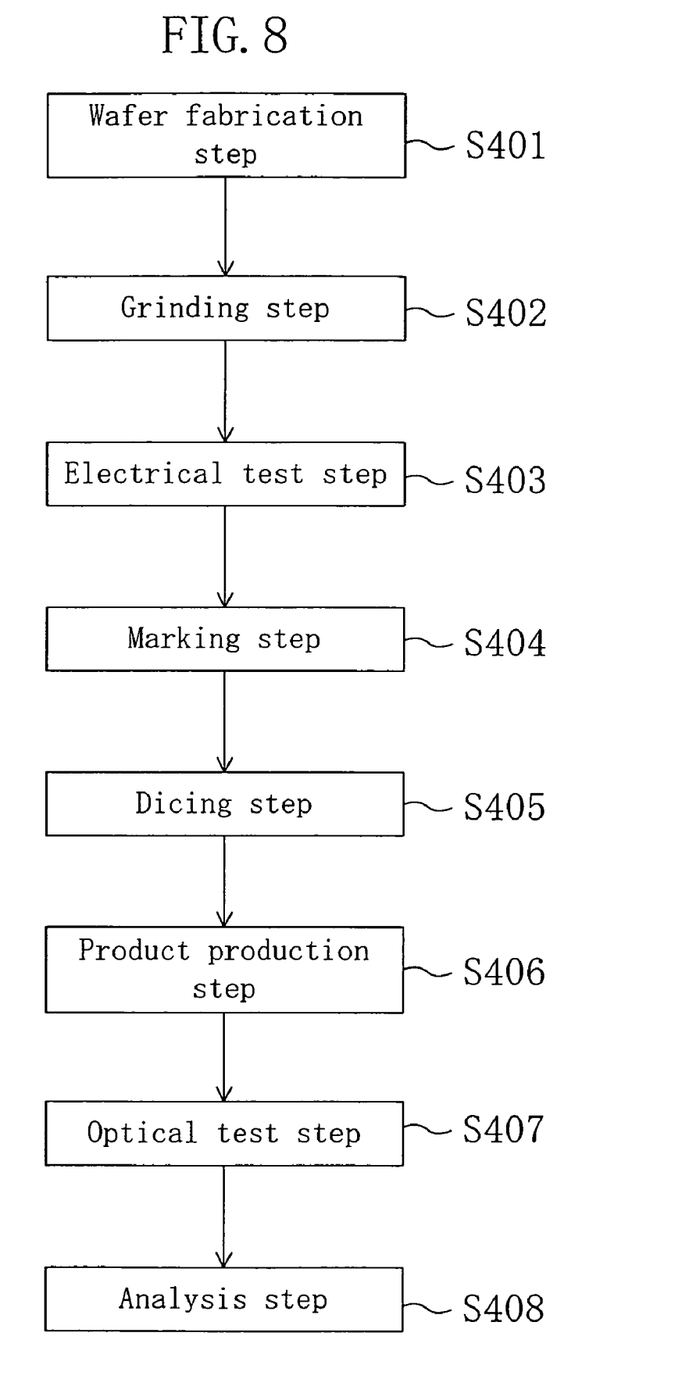
FIG. 8 is a flow chart showing a method for fabricating an optical element chip from an optical substrate according to the fourth embodiment.
Figure 9A:
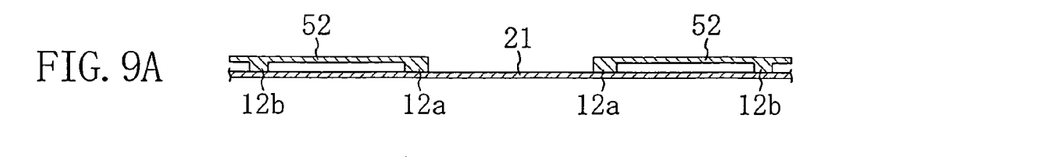
FIGS. 9A through 9F are cross-sectional views illustrating respective steps for fabricating the optical device 400 according to the fourth embodiment.
Figure 9B:
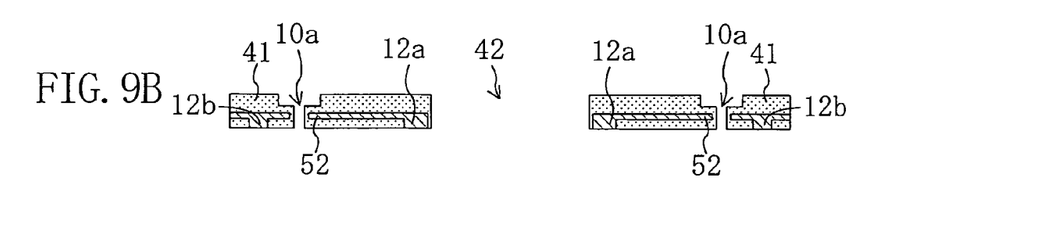
Figure 9C:
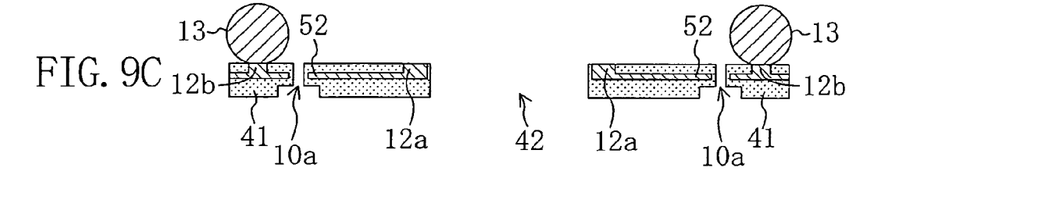
Figure 9D:
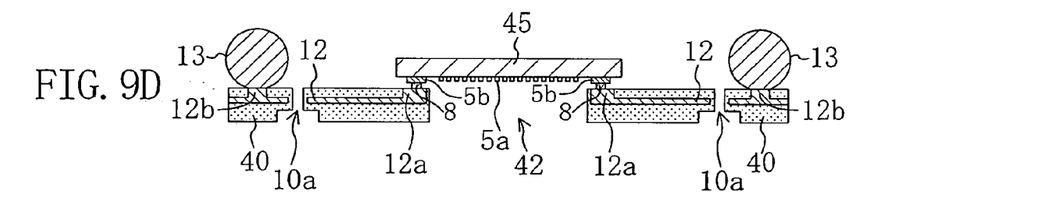
Figure 9E:
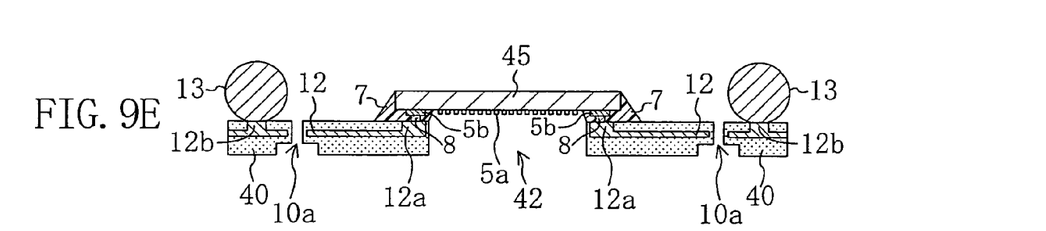
Figure 9F:
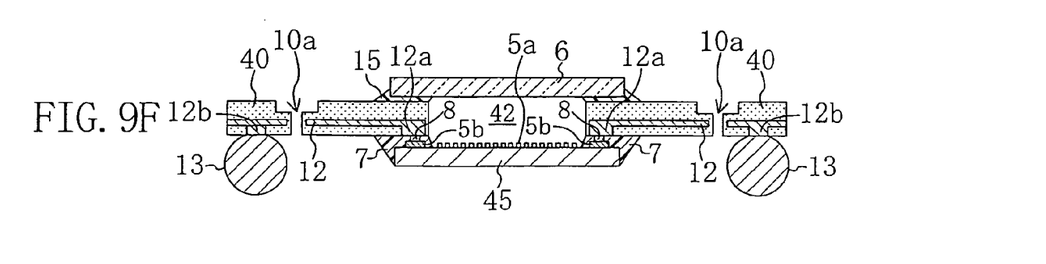

In a fourth embodiment, the structure of an optical device 400, a method for testing the performance of an optical device chip, and a method for fabricating the optical device 400 will be described with reference to FIGS. 7A and 7B, FIG. 8 and FIGS. 9A through 9F. FIGS. 7A and 7B are views illustrating the structure of the optical device 400. FIG. 8 is a flow chart showing a method for fabricating an optical element chip from an optical substrate. FIGS. 9A through 9F are cross-sectional views illustrating respective steps for fabricating the optical device 400. Also, FIG. 7B is a view illustrating a back surface of the optical device 400. And FIG. 7A is a cross-sectional view taken along the line VIIA—VIIA of FIG. 7B.

As shown in FIGS. 7A and 7B, the optical device 400 of this embodiment is obtained by replacing the optical element chip 5 and the device substrate 10 of the optical device shown in FIGS. 1A and 1B with an optical element chip 45 and a device substrate 40 described below, respectively. Other than that, the structure of the optical device and a method for fabricating the optical device according to this embodiment are the same as those of the first embodiment and therefore the description thereof will be omitted.

The device substrate 40 of this embodiment is approximately the same as the device substrate 30 of the third embodiment. Therefore, the position orientation of second terminal portions 13 in the device substrate 40 can not be identified through visual identification by observing the device substrate 40 through a translucent member. However, the position orientation of second terminal portions 13 in the device substrate 40 can be identified through visual identification in a different manner because an optical element chip 45 has a characteristic described below. Hereinafter, the optical element chip 45 of this embodiment will be described.

As shown in FIG. 7B, in the optical element chip 45, an orientation-indicating marker portion 45a including a character of A is formed on a back surface of the optical element chip 45. The orientation-indicating marker portion 45a indicates the position orientation of the second terminal portions 13 in the same manner as the orientation-indicating marker 35a of the third embodiment. For example, the orientation-indicating marker 45a is formed so that one of the second terminal portions 13 having a specific function is located on the left-hand side of the orientation-indicating marker 45a. Thus, the position of one of the second terminal portions 13 having a specific function can be identified through visual identification by observing the back surface of the optical device 400. Therefore, the optical device 400 of this embodiment exhibits approximately the same effects as those of the optical device 100 described in the first embodiment.

As in the third embodiment, it is preferable that the orientation-indicating marker 45a is given by a known marking method. Moreover, a divider portion of an upper molding die used in the step of molding in the method for fabricating an optical device according to this embodiment has a pillar shape with a rectangular base.

Furthermore, if the orientation-indicating marker 45a is formed on a back surface of each optical element chip while the optical element chip is still in a wafer state, not only the orientation of the optical device 400 can be identified but also the following effects can be achieved.

In general, an optical element chip is fabricated by dividing a substrate (such as an optical substrate and a wafer) in which a plurality of optical element chips are formed so as to be arranged side by side so that the individual optical element chips are separated from one another. Each of the optical element chips is electrically tested before the wafer is diced. Then, by using only ones of the optical element chips which have been judged as non-defective chips in the test, optical device are fabricated and final products such as a video camera are produced. Thereafter, optical test for the final products is performed and only final products which have been judged as non-defective products in the optical test are distributed to the market.

Each of the final products to which the optical test is performed includes only an optical element chip judged as a good optical element chip in the electric test. However, the optical performance of each optical element chip can not be tested while the optical element chip is still in a wafer state, and therefore, some of final products which have been produced using optical element chips judged as good optical element chips in the electric test are judged as defectives in the optical test. The final products judged as detectives can not be distributed to the market, so that production costs and time for the defective final products are wasted.

The above-described inconvenience occurs because results of an optical test can not be fed back to process steps for fabricating an optical device.

In many cases, a wafer is formed by repeating layer stacking, etching and the like, and a series of such process steps are performed using an apparatus and a plurality of optical element chips are fabricated at a time. In many cases, a fabrication apparatus includes a plurality of members having the same function, so that optical element chips located in the same location in different wafers have approximately the same performance. Therefore, even after dicing a wafer, if the position of each optical element chip in the wafer can be identified, results of an optical test can be fed back to process steps for fabricating an optical device. In view of this point, the present inventors have invented a method for tracing the dependency on a pattern repeatedly caused by a defect of the pattern, the dependency on a difference in equipment and variations in conditions. The method will be described with reference to FIG. 8. Hereinafter, a "test use" item means to be an item used for feedback of results of an optical test to process steps for fabricating an optical device. The following optical test is performed not only to "test use final products" but also "final products".

First, in the wafer fabrication step S401, a plurality of wafers, each including optical element chips formed in a surface thereof, are fabricated using the same method and the same fabrication apparatus. In this case, one of the wafers is used as a test use wafer for checking optical performances of the optical element chips. Then, the process proceeds with the grinding step S402. Note that in the following steps, it is preferable that the operation of each process step is performed to all of the wafers obtained in this step unless specifically stated.

In the grinding step S402, a surface (back surface) of a wafer located in the other side to a surface thereof in which the optical element chips are formed is grinded. Then, the process proceeds with the electric test step S403.

In the electric test step S403, an electric test is performed to each of the optical element chips formed on the wafer. Specifically, first, a test use signal waveform is input to each of the optical element chips and an output waveform from each of the optical element chips corresponding to the input waveform is detected. Then, the detected output waveform is compared to an ideal output waveform. If the comparison between the waveforms shows the output waveforms have approximately the same shape, it is judged that the optical element chip is good. If the comparison shows that the output waveforms have different shapes, it is judged that the optical element chip is defective. Ones of the optical element chips judged as defectives in the comparison are labeled as defectives on a surface of each of the optical element chips. Then, the process proceeds with the marking step S404.

In the marking step S404, a marker for indicating the position of the optical element chips in a wafer is given on a back surface of each optical element chip. In this case, it is preferable that the marker is given by a known marking method. Moreover, it is preferable that the marker is point-asymmetrical with respect to a center point of the back surface of the optical element chip. Then, the process step proceeds with the dicing step S405.

In the dicing step S405, a wafer is diced. Thus, a large number of optical element chips can be fabricated from a single wafer. Note that an optical element chip labeled as a defective on a surface thereof in the test step S402 is discarded after this step. Then, the process proceeds with the product fabrication step S406.

In the product fabrication step S406, test use optical device, optical apparatus and final product for checking the optical performance of an optical element chip are produced. Specifically, first, using a test use element chip obtained by dicing a test use wafer, a test use optical device is fabricated according to fabrication process steps shown in FIGS. 9A through 9F. In this case, the process steps shown in FIGS. 9A through 9F are approximately the same as those described in the first embodiment (FIGS. 3A through 3F) but are different from the fabrication process steps of the first embodiment in that an upper molding die with a rectangular cross-sectional shape in the molding step and an optical element chip 45 in which a marker is given on a back surface thereof is used. Thereafter, the test use optical device is mounted on a wiring board to fabricate a test use optical apparatus. Then, a cylindrical mirror is installed in the test use optical apparatus, thereby fabricating a test use final product such as a video camera. Then, the process proceeds with the optical test step S407.

In the optical test step S407, the test use final product is optically tested. Specifically, an electrical characteristic test and a visual identification test for image are performed to judge whether the test use final product is good or defective. Thereafter, the process proceeds with the analysis step S408.

In the analysis step S408, the relationship between the optical performance of each optical element chip and the position of the optical element chip in the wafer is examined. The optical performance of each optical element chip can be shown from test results in the optical test step S407. Specifically, in the optical test step S407, it can be assumed that an optical element chip mounted on a test use final product judged as good has an excellent optical performance and an optical element chip mounted on a test use final product judged as a defective has a poor optical performance. Moreover, the position of each optical chip in the wafer can be identified by observing the back surface of the test use optical device. Also, as has been described above, the same relationship is maintained between the optical performance of each optical element chip and the position of the optical element chip in a wafer even on a different wafer, and thus it is possible to assume, using this relationship, which optical element chip located where in the wafer can be used to fabricate an optical device and the like and then to fabricate a product with an excellent optical performance. Accordingly, if an optical product is fabricated according to the method of this embodiment, the above-described problems can be eliminated.

Thus, a method for testing the performance of an optical element chip according to this embodiment preferably has one of structures described below.

First, according to a first structure of the method for testing the performance of an optical element chip, the method includes the step of fabricating wafers including a test use wafer in which a plurality of optical element chips are formed on a surface thereof and which is for checking the optical performance of each optical element chip, the grinding step of grinding an opposite surface (back surface) of each of the wafers from a principal surface thereof, the electrical test step of performing an electrical test to each optical element chip, the marking step of giving a marker for indicating the position of optical element chips in each of the wafers, the dicing step of dicing each of the wafers after the marking step, the step of fabricating test use optical devices using test use optical element chips obtained by dicing the test use wafer, the step of fabricating test use optical apparatuses by mounting each of the test use optical devices on a wiring board, the step of fabricating test use final products by installing an optical member such as a cylindrical mirror in each of the test use optical apparatuses, the optical test step of performing an optical test to each of the test use final products, the analysis step of examining the relationship between the position of each test use optical element chip in the test use wafer and the optical performance of the test use optical element chip, based on results of the optical test, and the step of selecting, after the analysis step, only ones of the optical element chips indicating a more excellent optical performance than a certain optical performance from the optical element chips obtained by dicing the wafers other than the test use wafer, based on the relationship between the position of each optical element chip in the test use wafer and the optical element of the optical element chip, to fabricate an optical device.

To describe the first structure in other words, first, test use final products are fabricated using test use optical element chips obtained by dicing a test use wafer, and then an optical test is performed to the test use final product. Next, from a result of the optical test, the position of the optical element chips in each wafer is related to the optical performances of the optical element chips. Subsequently, based on the relationship, products with an excellent optical performance are fabricated using optical element chips obtained by dicing another wafer and assumed to have an excellent optical performance.

The method for testing the performance test of an optical element chip according to this embodiment may also have the following structure.

According to a second structure of the method the method for testing the performance of an optical element chip, the method includes the step of fabricating a test use wafer in which a plurality of optical element chips are formed on a surface thereof and which is for checking the optical performance of each of the optical element chips, the grinding step of grinding an opposite surface (back surface) of the test use wafer from a principal surface thereof, the electrical test step of performing an electrical test to each of the optical element chips, the marking step of giving on a back surface of each of the optical element chips, a marker for indicating the position of the optical element chips in the test use wafer, the dicing step of dicing the test use wafer after the marking step, the step of fabricating test use optical devices using test use optical element chips obtained by dicing the test use wafer, the step of fabricating test use optical apparatuses by mounting each of the test use optical devices on a wiring board, the optical test step of performing an optical test to each of the test use optical apparatuses, the analysis step of examining the relationship between the position of each of the test use optical element chips in the test use wafer and the optical performance of the test use optical element chip, based on results of the optical test, the step of repairing, after the analysis step, defective part in an apparatus for fabricating the optical element chips, based on the relationship between the position of each of the optical element chips in the test use wafer and the optical performance of the optical element chip, the step of fabricating wafers using the apparatus, and the step of fabricating optical products using optical element chips obtained by dicing each of the wafers.

The second structure is different from the first structure in that the second structure includes the step of repairing an apparatus for fabricating optical element chips. Because the second structure includes this step, more optical element chips with an excellent optical performance can be fabricated when wafers are fabricated using the second structure than when wafers are fabricated using the first structure. Thus, a better yield of final products can be achieved with the second structure than the first structure. Therefore, the second structure is more preferable than the first structure.

Moreover, a marker given in the marking step is preferably a point-asymmetrical symbol, an asymmetrical character or a combination of a symbol and a character. Thus, not only the above-described problems can be eliminated but also the position orientation of the second terminal portions 13 in the optical device 400 including the optical element chip 45 can be preferably identified.

Note that the orientation-indicating marker 45a in this embodiment may be some other alphabet than "A", a kana (Japanese syllabic script), a kanji (Japanese Chinese-derived character) or a numeric character. Moreover, for example, the orientation-indicating marker 45a may be a mixture of an alphabet and a kana. Furthermore, assume that the orientation-indicating marker 45a is formed of a plurality of characters and symbols. Then, even if one of the characters and symbols is point symmetrical, the orientation-indicating marker 45a can be used as long as the orientation-indicating marker 45a as a whole is point-asymmetrical with respect to the approximate center of the optical element chip 45.

Moreover, in the method for testing a performance of an optical element chip according to this embodiment, first, the test step S402 is performed and then the grinding step S401, the marking step S403, the dicing step S404 and the selection step S405 may be performed in this order. Moreover, a result of a good/defective test may be labeled on a back surface of the optical element chip 45.

An optical chip judged to be optically good in the method for testing the performance of an optical element chip according to this embodiment can be used not only for the optical device 400 of FIG. 7 but also as an optical element chip in which a solid state imaging element, such as a CCD or a CMOS, installed in an image sensor, an optical element chip in which a receiving element installed in a laser or the like.

Fifth Embodiment

Figure 10:
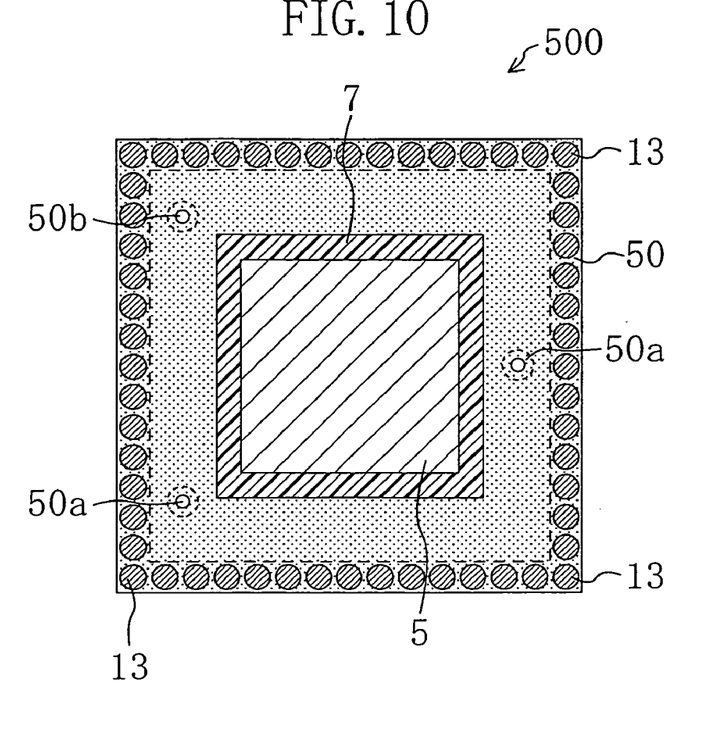
FIG. 10 is a plan view of a device substrate 50 according to a fifth embodiment of the present invention.

In a fifth embodiment according to the present invention, the structure of a device substrate 50 will be described with reference to FIG. 10. FIG. 10 is a view illustrating a back surface of the device substrate 50.

An optical device in this embodiment is an optical device obtained by replacing the device substrate 10 of the optical device shown in FIGS. 1A and 1B with the device substrate 50. Other than that, the structure of the optical device and a method for fabricating the optical device according to this embodiment are the same as those of the first embodiment and therefore the description thereof will be omitted.

In the device substrate 50 of this embodiment, the outline shape of a first opening mouth is a rectangle. Thus, the position orientation of the second terminal portions 13 in the device substrate 50 can not be identified through visual identification by observing the device substrate through a translucent member. However, the position orientation of second terminal portions 13 in the device substrate 50 can be identified through visual identification in a different manner because the device substrate 50 has a characteristic described below. Hereinafter, the device substrate 50 of this embodiment will be described.

In the device substrate 50, the position defining holes 50a described in the first embodiment and an orientation-indicating through hole 50b for indicating the position orientation of the second terminal portions 13 in the device substrate 50 are formed. The orientation-indicating through hole 50b is formed in part of the device substrate 50 located close to one of the second terminal portions 13 having a specific function. Thus, one of the second terminal portions 13 having a specific function can be identified through visual identification by visually observing the optical device. Accordingly, the optical device of this embodiment exhibits approximately the same effects of those of the optical device 100 of the first embodiment.

Note that the orientation-indicating through hole 50b is preferably formed in some other part of the device substrate 50 than parts in which the second terminal portions 13 are formed and a first sealing resin 7 is provided.

Moreover, in the molding step in the method for fabricating an optical device according to this embodiment, three pin members are used. Furthermore, a divider portion in an upper molding die used in this embodiment has a pillar shape with a rectangular base.

OTHER EMBODIMENTS

The present invention may be configured in the following manner in connection with the first through fifth embodiments.

An optical device according to the present invention may be configured so as to include the point-asymmetrical potions 3a and 23a, the orientation-indicating markers 35a and 45a, and the orientation-indicating through hole 50b. Moreover, the optical device may be configured so as to include the point-asymmetrical potions 3a and 23a and the orientation-indicating markers 35a and 45a. Furthermore, the optical device may be configured so as to include the point-asymmetrical potions 3a and 23a and the orientation-indicating through hole 50b.

Moreover, instead of the position defining holes 10a provided in the device substrate 10, a position defining level-difference portion may be provided in a peripheral portion of the device substrate 10. The position defining level-difference portion has approximately the same function as that of the position defining holes 10a.

Moreover, the second terminal portions 13 may be arranged so as to be point-asymmetrical with respect to a center point in a surface of the device substrate having the second opening mouth 4.

Moreover, in process steps for fabricating the optical device 100, the optical element chip 5 of FIG. 3F may be divided into individual optical devices after the optical element chip 5 of FIG. 3F is mounted on the device substrate 10 or after the translucent member 6 of FIG. 3G is installed on the device substrate 10.

Moreover, although the molding step in process steps for fabricating the optical device 100 is performed with the lead frame 52 placed on the sealing tape 21, the sealing tape 21 does not have to be used. However, when the sealing tape 21 is used, upper and lower surfaces of the lead frame 52 can be clamped with the upper molding die and the lower molding die and thus the upper and lower surfaces of the lead frame 52 can be stably kept adhered with a surface of the molding die. That is, a plastic resin can be filled in the molding die with the upper and lower surfaces of the lead frame 52 adhered with the surface of the molding die. As a result, mold flash due to molding can be effectively suppressed and a structure in which the exposed surfaces of the internal terminal portions 12a and the external terminal portions 12b are located at the device substrate 10 can be obtained. Therefore, simplification and facilitation of mounting the optical device 100 can be achieved. For example, a soldered connection can be provided in a simple manner when the optical device 100 is mounted on a wiring board.

The present invention may be configured in the following manner in connection with the first and second embodiments.

For example, the outline of the first opening mouth may have a shape obtained by forming an area reduced portion in at least part of an outline of a regular polygon so that the area of the first opening mouth is smaller than the area of the regular polygon. Also, the outline of the first opening mouth may have a shape with an area increase portion formed in at least part of the outline of a regular polygon so that the area of the first opening mouth is larger than the area of the regular polygon. Moreover, the outline shape of the first opening mouth may be a shape obtained by forming an area reduction portion in at least part of the outline of a circle so that the area of the first opening mouth is smaller than the area of the circle. Also, the outline shape of the first opening mouth may be a shape obtained by forming an area increased portion in at least part of the outline of a circle so that the area of the opening at the first opening mouth is larger than the area of the circle.

As has been described, the present invention is useful for an optical device including an optical element in which an optical element for emitting and receiving light is formed and an optical apparatus including the optical device.

What is claimed is:

1. An optical device comprising:
    a device substrate including an opening formed so as to extend substantially in the vertical direction with respect to a surface of the device substrate and pass through the device substrate;
    a translucent member provided so as to cover a first opening mouth of the opening;
    an optical element chip provided so as to cover a second opening mouth of the opening and including an optical element for emitting or receiving light in a surface of the optical element chip facing the translucent member;
    a conductive portion provided so as to have part buried in the device substrate and including first terminal portions each of which is electrically connected to the optical element and second terminal portions each of which is electrically connected to a wiring board; and
    an encapsulant for encapsulating an electrical connection portion of the optical element and each of the first terminal portions,
    wherein an outline shape of the first opening mouth is point-asymmetrical with respect to an approximate center point of the first opening mouth.

2. The optical device of claim 1, wherein the first opening mouth having a point-asymmetrical outline shape has the function of indicating a position orientation of the second terminal portions in the device substrate.

3. The optical device of claim 1, wherein an outline of the first opening mouth has an approximate rectangular shape obtained by linearly cutting off at least a portion including a vertex of a rectangle.

4. The optical device of claim 1, wherein an outline of the first opening mouth has an approximate rectangular shape obtained by roundly cutting off at least a portion including a vertex of a rectangle.

* * * * *